(12) United States Patent
Cork (10) Patent No.: US 8,415,953 B2
(45) Date of Patent: Apr. 9, 2013

(54) UPCONVERTER

(75) Inventor: Peter Cork, Romsey (GB)

(73) Assignee: Siemens Aktiengesellschaft, Munich (DE)

( * ) Notice: Subject to any disclaimer, the term of this patent is extended or adjusted under 35 U.S.C. 154(b) by 400 days.

(21) Appl. No.: 12/874,706

(22) Filed: Sep. 2, 2010

(65) Prior Publication Data

US 2011/0059716 A1 Mar. 10, 2011

(30) Foreign Application Priority Data

Sep. 8, 2009 (GB) .................................. 0915657.1
Apr. 1, 2010 (GB) .................................. 1005543.2

(51) Int. Cl.
*G01V 3/00* (2006.01)
(52) U.S. Cl. ....................................................... 324/322
(58) Field of Classification Search ........... 324/300–322
See application file for complete search history.

(56) References Cited

U.S. PATENT DOCUMENTS

| | | | |
|---|---|---|---|
| 3,611,110 A | 10/1971 | Corbey et al. | |
| 3,824,482 A | 7/1974 | Whelehan, Jr. | |
| 5,245,288 A | 9/1993 | Leussler | |
| 5,384,536 A | 1/1995 | Murakami et al. | |
| 6,906,520 B2 | 6/2005 | Heid et al. | |
| 7,123,009 B1 | 10/2006 | Scott | |
| 7,323,876 B2 | 1/2008 | Den Boef | |
| 7,417,433 B2 | 8/2008 | Heid et al. | |
| 7,622,928 B2 | 11/2009 | Gauss et al. | |
| 7,701,220 B2 | 4/2010 | Ehnholm | |
| 7,750,630 B2 | 7/2010 | Van Helvoort et al. | |
| 7,750,635 B2 | 7/2010 | Van Helvoort et al. | |
| 7,777,492 B2 | 8/2010 | Vernickel et al. | |
| 8,129,992 B2 * | 3/2012 | Cork et al. ..................... | 324/318 |
| 8,283,927 B2 * | 10/2012 | Cork et al. ..................... | 324/322 |
| 2003/0206019 A1 | 11/2003 | Boskamp | |
| 2007/0013376 A1 | 1/2007 | Heid et al. | |
| 2007/0188175 A1 | 8/2007 | Burdick, Jr. et al. | |
| 2007/0207763 A1 | 9/2007 | Bollenbeck et al. | |
| 2008/0157769 A1 | 7/2008 | Renz et al. | |

(Continued)

FOREIGN PATENT DOCUMENTS

GB 1132545 1/1967

OTHER PUBLICATIONS

"Behavioral Modeling and Simulation of a Parametric Power Amplifier," Gray et al., IMS (2009) pp. 1373-1376.
U.S. Appl. No. 12/726,567, filed Mar. 18, 2010 (Markus Vester).

(Continued)

*Primary Examiner* — Dixomara Vargas
(74) *Attorney, Agent, or Firm* — Schiff Hardin LLP (57) ABSTRACT

A hybrid upconverter has a low noise amplifier and a two port parametric amplifier. The parametric amplifier has a first port to receive an input signal to be amplified and upconverted and a second port to receive a local oscillator signal and to output the amplified, upconverted signal at upper and lower sideband frequencies. The parametric amplifier further has an antenna coupled to the second port to receive the local oscillator signal and transmit the amplified, upconverted signal at upper and lower sideband frequencies. The low noise amplifier drives the first port of the parametric amplifier. The two port parametric amplifier has a pair of varactor diodes connected between the first port and the second port. The diodes are connected in parallel from the first port and in series from the second port. The low noise amplifier is connected directly to the pair of varactor diodes.

16 Claims, 9 Drawing Sheets

U.S. PATENT DOCUMENTS

| | | | |
|---|---|---|---|
| 2008/0246477 A1 | 10/2008 | Nakabayashi | |
| 2009/0286478 A1 | 11/2009 | Biber et al. | |
| 2010/0117650 A1* | 5/2010 | Cork et al. | 324/322 |
| 2010/0117652 A1* | 5/2010 | Cork et al. | 324/322 |
| 2010/0253345 A1* | 10/2010 | Vester | 324/316 |
| 2010/0253346 A1* | 10/2010 | Hulbert | 324/316 |
| 2010/0253349 A1* | 10/2010 | Cork et al. | 324/318 |
| 2010/0253352 A1* | 10/2010 | Hulbert | 324/318 |
| 2010/0253353 A1* | 10/2010 | Cork et al. | 324/318 |

OTHER PUBLICATIONS

U.S. Appl. No. 12/753,159, filed Apr. 2, 2010 (Cork et al.).
U.S. Appl. No. 12/753,132, filed Apr. 2, 2010 (Cork et al.).
U.S. Appl. No. 12/753,150, filed Apr. 2, 2010 (Anthony Hulbert).
U.S. Appl. No. 12/753,134, filed Apr. 2, 2010 (Hulbert et al.).
U.S. Appl. No. 12/753,148, filed Apr. 2, 2010 (Huish et al.).
U.S. Appl. No. 12/753,138, filed Apr. 2, 2010 (Huish et al.).

* cited by examiner

UPCONVERTER

BACKGROUND OF THE INVENTION

1. Field of the Invention

This invention relates to an upconverter, in particular for use in magnetic resonance imaging (MRI).

2. Description of the Prior Art

MRI scanners use a combination of a strong constant magnetic field ($B_0$) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the $B_1$ field and with the signals generated from the patient so 'traps' (high impedance sections) must be included at regular (typically $\lambda/8$) intervals. These add cost and inconvenience to the structure.

In use, the requirement to connect the cables and sterilise them between scanning one patient and the next leads to increased down-time between scans. It is therefore desirable that the cables be eliminated.

Co-pending patent applications GB0915648.0 (corresponding to U.S. Ser. No. 12/726,741 filed Mar. 18, 2010), GB0915653.0 (corresponding to U.S. Ser. No. 12/753,132 filed Apr. 2, 2010) and GB0915655.5 (corresponding to U.S. Ser. No. 12/726,567 filed Mar. 18, 2010) describe a wireless coils implementation that makes use of parametric amplifiers, each connected to one of a number of local coils and each also connected to a microwave antenna, hereinafter referred to as a patient microwave antenna. In addition the bore of the scanner is lined with microwave antennas, hereinafter referred to as bore microwave antennas, tuned to the same frequency as the other antennas. It is arranged that the bore microwave antennas transmit a local oscillator signal that is received by the patient microwave antennas. This signal provides the necessary power and means to make the parametric amplifiers operational to upconvert the local signal to the microwave frequencies. The upconverted signals are radiated from the patient microwave antenna and received at the bore microwave antennas. Receivers, connected to one or more of the bore microwave antennas use the same local oscillator to downconvert the signals back to the original frequency.

Figure 4:
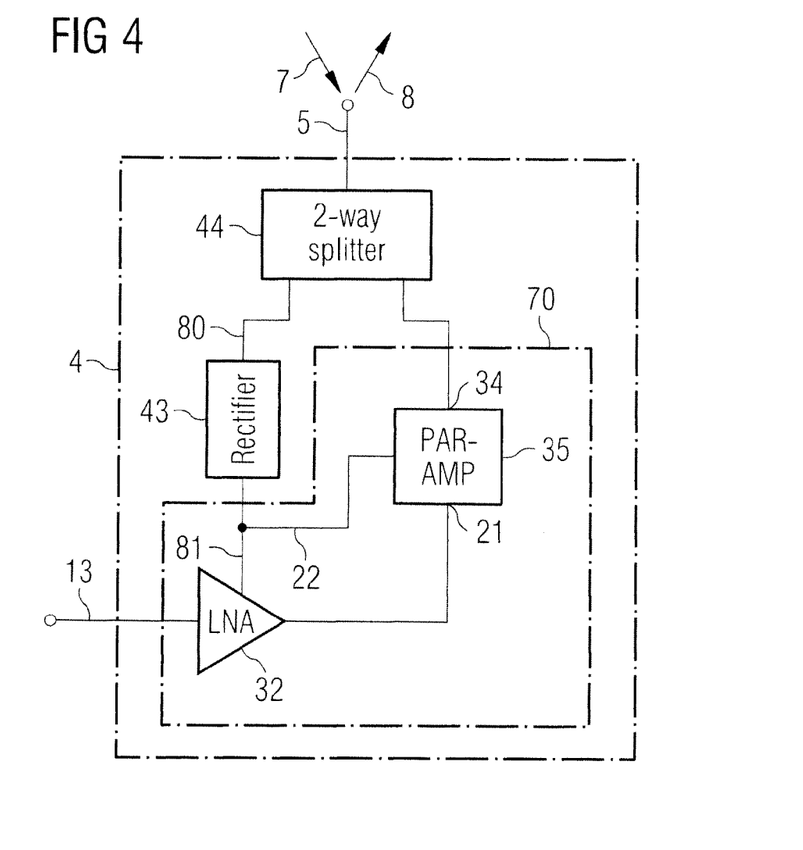
FIG. 4 is a block diagram of an upconverter for use in the method of the present invention.

Co-pending patent application no. GB0915648.0 (corresponding to U.S. Ser. No. 12/776,741 filed Mar. 18, 2010) describes a hybrid parametric amplifier comprising a low noise amplifier driving a parametric amplifier core as shown in FIG. 4.

The gain and stability of parametric amplifiers is sensitive to the received level of local oscillator (LO), but generally, it is not possible to constrain the variation of local oscillator power to a range less than several decibels.

In another co-pending UK patent application GB0915653.0 (corresponding to U.S. Ser. No. 12/753,132 filed Apr. 2, 2010), a parametric amplifier device comprising a two port parametric amplifier, a DC voltage generator and a DC bias regulator enables the bias voltage in the parametric amplifier to be adjusted in sympathy with the measured received local oscillator voltage in the parametric amplifier in such a way as to detune the parametric amplifier for higher local oscillator voltages such that the gain remained substantially constant. The circuit to do this is potentially complicated and sensitive, particularly when compensation is required under variable drive and load impedance as well as LO level.

SUMMARY OF THE INVENTION

In accordance with a first aspect of the present invention a hybrid upconverter has a low noise amplifier and a two port parametric amplifier, the parametric amplifier comprising a first port to receive an input signal to be amplified and upconverted and a second port to receive a local oscillator signal and to output the amplified, upconverted signal at upper and lower sideband frequencies. The parametric amplifier further has an antenna coupled to the second port to receive the local oscillator signal and transmit the amplified, upconverted signal at upper and lower sideband frequencies. The low noise amplifier drives the first port of the parametric amplifier. The two port parametric amplifier has a pair of varactor diodes connected between the first port and the second port. The diodes are connected in parallel from the first port and in series from the second port; and the low noise amplifier is connected directly to the pair of varactor diodes.

In the present invention, the low noise amplifier, having a relatively high impedance, typically of the order of several thousand ohms, is directly connected to the varactor diode pair of the parametric amplifier, which is also a relatively high impedance point. The presence of the low noise amplifier reduces the required gain in the two port parametric amplifier, so that the present invention can avoid the need for a gain compensation loop, resulting in a significant circuit simplification and potential cost savings.

Preferably, the output impedance of the low noise amplifier is reduced by additional drain loading.

Preferably, the additional drain loading reduces the output impedance to a value of the order of $270\Omega$.

Damping the output impedance to of the order of $270\Omega$, allows the second port of the parametric amplifier to be tuned to a centre frequency at a lower frequency than the local oscillator frequency, without becoming unstable.

Preferably, the upconverter further has a power harvester that receives local oscillator power and generates a DC bias voltage for the parametric amplifier and a supply for the low noise amplifier.

Preferably, the low noise amplifier supplies the bias voltage to the parametric amplifier.

Preferably, the upconverter further comprises a power splitter between the antenna and the parametric amplifier; wherein the power splitter splits incident local oscillator power between the power harvester and the parametric amplifier.

Preferably, the first port is an RF port and receives signals in the frequency range 20 MHz to 500 MHz.

Preferably, the second port is a microwave port and receives signals in the frequency range 1 GHz to 5 GHz.

In accordance with a second aspect of the present invention, a wireless magnetic resonance imaging system has a local oscillator and transceiver array mounted in a bore of the system; and a wireless local coil array and upconversion stage embodying a number of upconverters according to the first aspect.

In accordance with a third aspect of the present invention, a method of controlling gain in a hybrid upconverter having a two port parametric amplifier and a low noise amplifier, the two port parametric amplifier having a first port to receive an input signal to be amplified and upconverted, a second port to receive a local oscillator signal and to output the amplified, upconverted signal at upper and lower sideband frequencies, and a pair of varactor diodes connected between the first port and the second port, includes the steps of the varactor diodes in parallel from the first port and in series from the second port, connecting the low noise amplifier output directly to the pair of varactor diodes, and driving the parametric amplifier with the low noise amplifier.

Preferably, the method further includes reducing the output impedance of the low noise amplifier by additional drain loading.

Preferably, the additional drain loading reduces the output impedance to a value of the order of 270Ω.

Preferably, the first port receives signals in the frequency range 20 MHz to 500 MHz.

Preferably, the second port receives signals in the frequency range 1 GHz to 5 GHz.

DESCRIPTION OF THE PREFERRED EMBODIMENTS

The present invention addresses the problem of variation of incident local oscillator level encountered when using parametric amplifiers in the confines of the multiply illuminated scanner bore, where various multipath effects lead to significant variation in the path loss between the bore mounted LO sources and the patient coil mounted parametric amplifiers.

Figure 1:
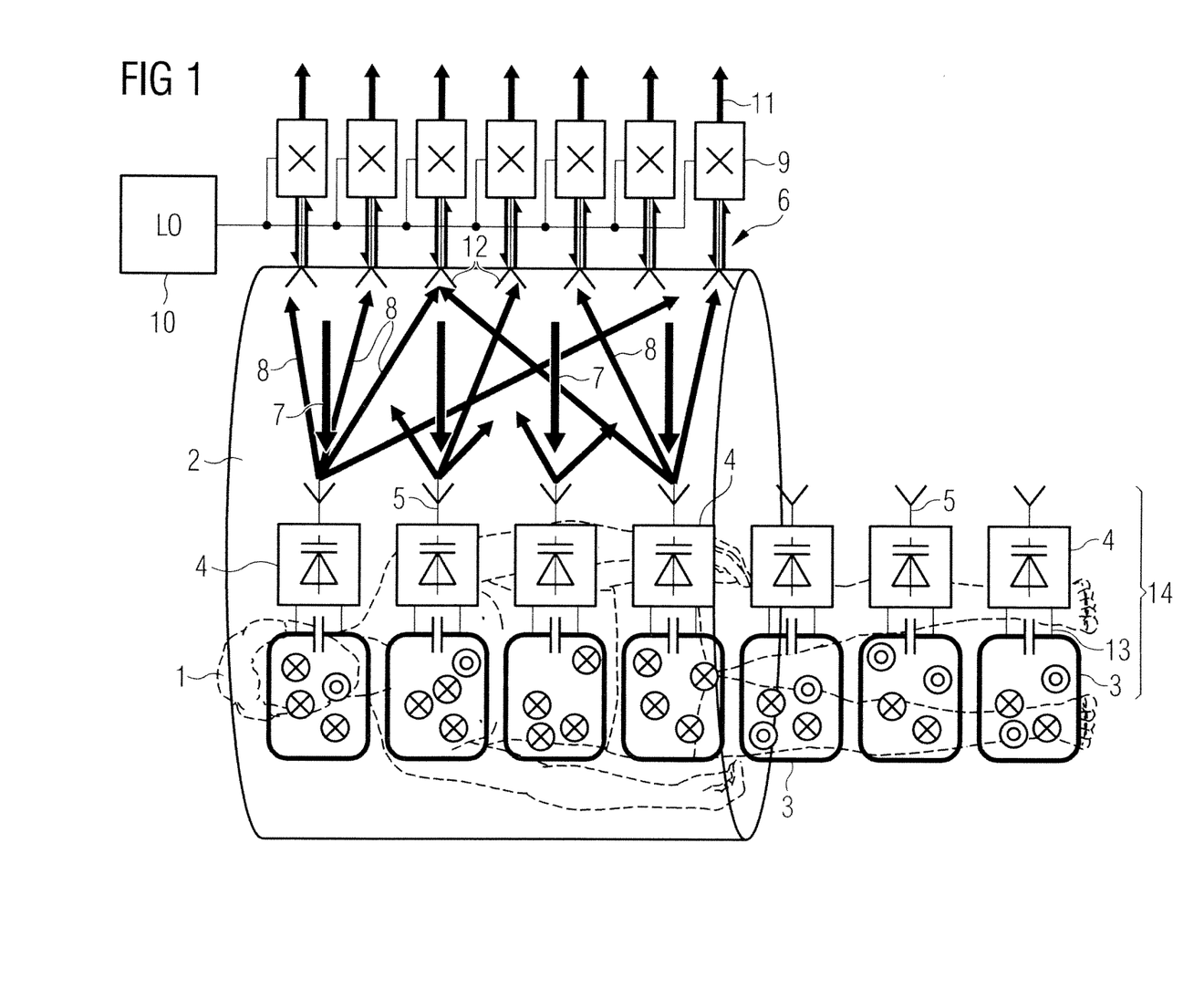
FIG. 1 illustrates an example of an MRI system using upconverters.

An example of an MRI system using a MIMO microwave link, in which parametric amplifier devices in accordance with the present invention are used, will now be described. FIG. 1 shows a patient 1 within an MRI scanner bore tube 2. A mat covers the part of the patient for imaging and embedded in the mat are a plurality of local coils 3. Associated with each local coil 3 is an upconverter stage 4 and microwave antenna 5. Transceivers 9, connected to an array 6 of antennas 12, are integrated into the scanner bore 2. A parametric amplifier circuit in the upconverter carries out the mixing and amplification necessary for upconversion of a magnetic resonance (MR) signals 13 received from each of the local coils 3.

The signals produced in the frequency upconverter 4 for each patient mat are transmitted to the array of transceivers in the scanner bore 2. A local oscillator (LO) signal at around 2.4 GHz, or other chosen microwave frequency, feeds the antenna array 6 to illuminate the patient coil electronics 14 with a signal 7 at the local oscillator frequency. Parametric amplifiers in the upconverter stage 4 use the incident local oscillator signal 7 to provide a frequency reference and power for upconversion. The MR signals 13 from the coils are thereby converted to microwave frequency signal 8 and transmitted to the bore transceiver antenna array 6. The same local oscillator signal in the transceivers converts the upconverted signals 8, from the patient coils 3, at the LO frequency±63 MHz, back to the original MR frequency of 63 MHz for input 11 to MR receivers in an image processing system (not shown.) The Larmor frequency ω0 is dependent upon the gyromagnetic ratio γ and the magnetic field strength B0, so in the case of a 1.5 Tesla magnet, the MR frequency is 63.6 MHz, or for a 3 T magnet, the MR frequency is 123 MHz. These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

Figure 2:
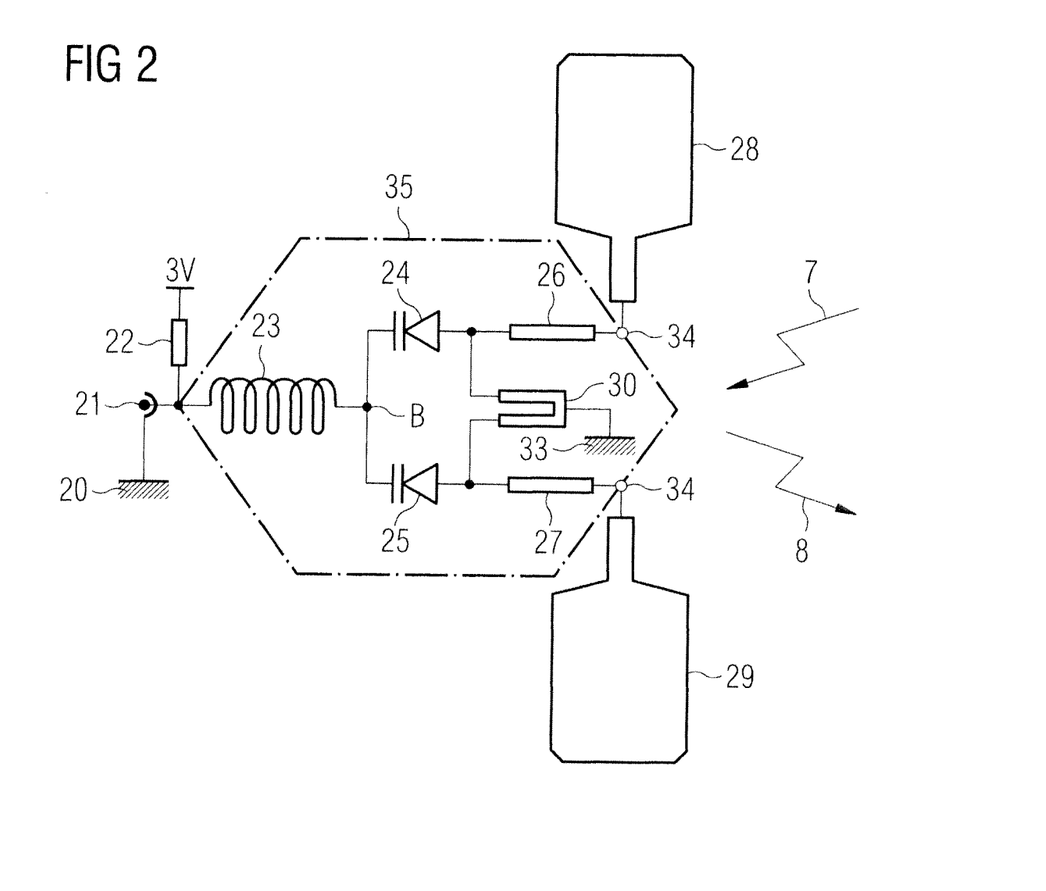
FIG. 2 illustrates in more detail, an example of a parametric amplifier for use in an upconverter in the system of FIG. 1.

An example of the parametric amplifier is shown in more detail in FIG. 2. The example of FIG. 2 comprises a parametric amplifier core 35 having a single ended RF input 21 to receive the signal 13 from the local coil and an earth 20 at the input and an output port 34 for connection to a dipole antenna 28, 29. In this example, the magnetic resonance signal is at 63.6 MHz. The RF signal 13 is fed via a high Q RF input inductor 23 to drive the varactor diode pair 24, 25 in common mode parallel with 'earth return' via the shunt matching line pair 30 to ground connection 33. A high impedance (very low current requirement) voltage source provides bias voltage 22 at e.g. 3V via the high Q RF input matching choke 23 to the varactor diode pair 24, 25 (e.g. BBY53-02V) to set the correct operational capacitance bias point. Incident local oscillator 'pump' signal 7 (at a frequency for example of 2.44 GHz) received by the microwave antenna 28, 29 is fed via the appropriate printed microwave series matching lines 26, 27 and shunt matching lines 30 to provide differential drive (with centre ground 33) to the varactor diode pair 24, 25. This differential LO signal 7 mixes with the common mode RF drive signal 13 in the varactor diodes 24, 25 to produce microwave frequency lower side band (LSB) and upper side band (USB) products. These differential mode mixing products are fed back through the microwave matching lines 26, 27 to the microwave antenna 28, 29 for transmission back to the bore array of transceivers.

The two varactor diodes 24, 25 of the parametric amplifier circuit serve as an upconverter and an amplifier that requires no DC power supply, using directly the 'pump' signal 7 as a local oscillator and source of power. Parametric amplifiers are typically two port devices where a first port receives an input signal at a relatively low frequency to be upconverted and amplified and a second port both receives the pump signal at a relatively high frequency and outputs the relatively high frequency upconverted and amplified mixing product. Circulators are commonly used to separate the upconverted output signals from the incident LO drive signals, but these ferromagnetic based devices are not suitable for MRI applications because of the BO field. Instead, re-radiated LSB/USB signals are separated from the incident LO in filters in the bore transceivers.

For the example, it is desirable that the pump signal 7 to the parametric amplifier should be received from an over-the-air transmission in order to remove any requirement for a DC power supply to the mat. The total bandwidth occupied by the upper and lower sidebands and the pump signal 7 is typically small enough to fall within the efficient bandwidth of a single antenna. Thus, a two port parametric amplifier circuit, is provided such that the first port 21 receives the input signal 13 to be upconverted and amplified and the second port 34 receives the pump signal 7 and also outputs the upconverted and amplified input signal 8 at the upper and lower sideband frequencies.

The local oscillator signal 7 received by the dipole antenna 28, 29 from the bore array transmitters 9 arrives at the microwave port 34 at a power level of +10 dBm. This 'pump' signal is fed via the printed line matching 26, 27 to the varactor diode pair 24, 25. The common cathode configuration of the varactor diodes, with the anodes connected one to each half of the balanced feed from the dipole antenna 28, 29, results in antiphase stimulation of the varactor diodes at the LO (pump) frequency. RF stimulation via the RF input inductor 23 at the common cathode node leads to in-phase stimulation of the varactor diodes 24, 25 at the RF frequency. The resulting LSB and USB signals generated in each of the two varactor diodes are therefore in anti-phase. These wanted output signals, along with the greater (reflected) part of the incident LO signal 7, are then conveyed via the printed line matching 26, 27 back to the dipole antenna 28, 29 where the signals 8 are broadcast into the bore 2 for reception by the bore receiver array system 6, 9, 10.

The high Q RF input matching choke 23 in series with the single ended RF input 21 is series resonant with the high capacitive reactance of the varactor diodes 24, 25 at the RF frequency. The ground return for the RF feed 21 is provided by the center grounding 33 of the microwave port shunt line. The center-grounded shunt microstrip line in the microwave port resonates with the greater part of the high capacitive admittance of the varactor diodes 24, 25 at the microwave port frequency. The balanced pair of series lines 26, 27 then tunes out the remainder of the capacitive reactance of the varactor diodes and completes the impedance transformation to match to the 22Ω balanced load of the microwave dipole antenna 28, 29.

In this implementation, the diodes are connected in parallel for the RF feed, to halve the high impedance of the varactor diodes at 63.6 MHz RF for presentation at the RF port. The diodes are connected in series for the microwave port 34 to double the very low impedance of the varactor diodes at 2.442 GHz for presentation at the microwave port. The series/parallel configuration lends itself to single ended RF drive, balanced microwave drive and two port operation. A single ended RF drive is appropriate at 63.6 MHz and is effected by means of drive through the RF input choke 23 and ground return 33 at the microwave port voltage node. A balanced microwave port is appropriate at 2.44 GHz for connection to a dipole antenna.

The microwave port operates fully balanced for LO "pump" feed at 2.442 GHz as well as for the output frequencies at 2.442 GHz±63.6 MHz. This obviates the need for any low impedance grounding in the microwave port circuits. Operation of the microwave port fully balanced suits perfectly connection to the balanced dipole antenna 28, 29 for reception of the LO signal 7 and re-radiation of the LSB and USB signals 8. The parametric amplifier mixing process by nature involves at least 4 frequencies, whereby both USB and LSB are generated from the mixing of LO and RF as well as various harmonics of the aforementioned. Typically, by the use of selective port filtering to restrict the range of RF and LO frequencies applied and to implement selection of a single output mixing product (e.g. USB only, parametric amplifiers are restricted largely to 3 wanted frequencies of operation— an RF frequency, an LO frequency and a single desired mixing product.

Figure 5:
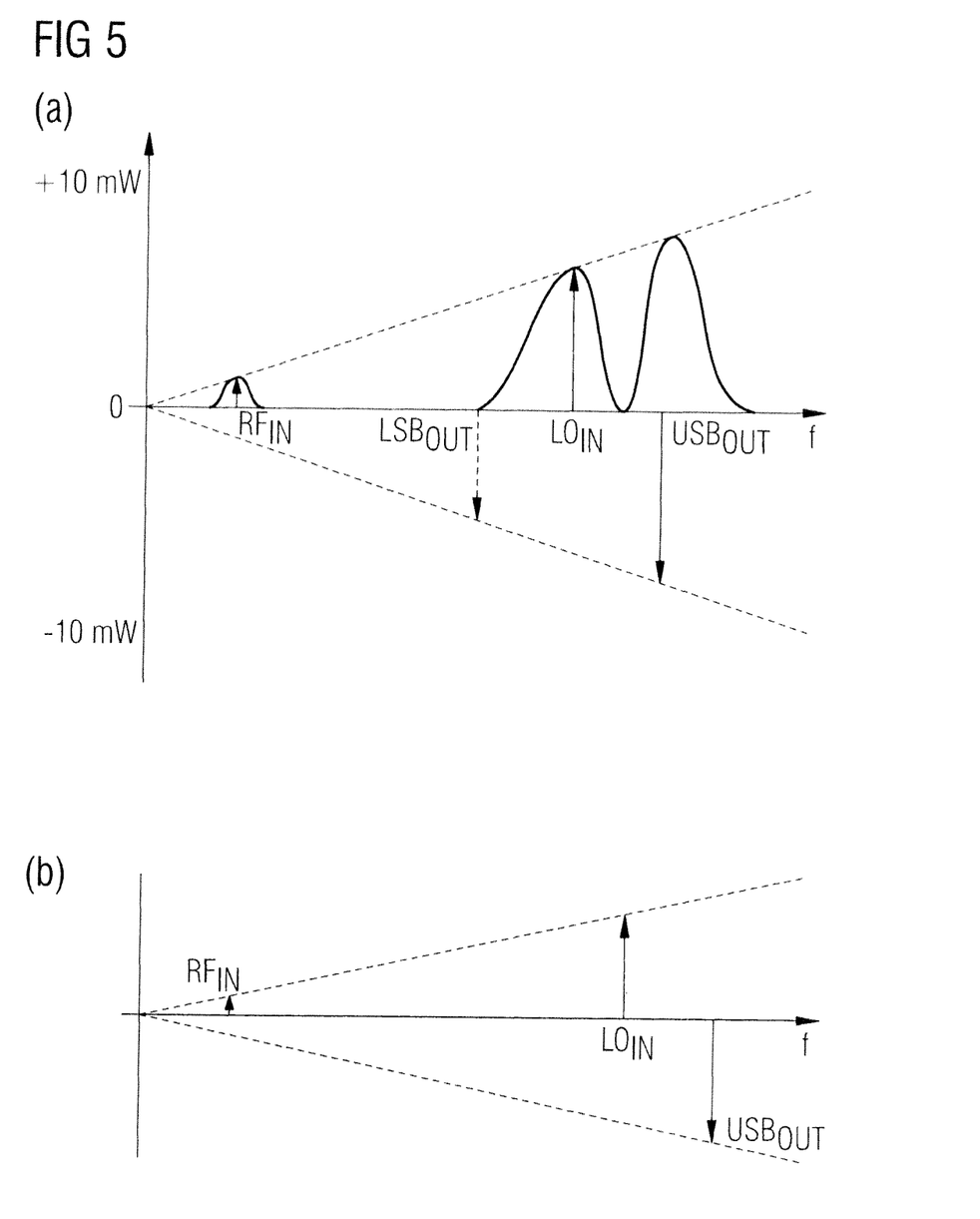
FIG. 5a illustrates the Manley-Rowe relationship for 3-frequency operation in a parametric amplifier with suitable filtering.
FIG. 5b illustrates fundamental 3-frequency upconversion to upper sideband.
FIG. 5c illustrates fundamental 3-frequency upconversion to upper sideband, with the local oscillator shifted down by the RF frequency with respect to FIG. 5b.
FIG. 5d illustrates inversion of FIG. 5c for self oscillation.
FIG. 5e illustrates an infinite gain condition.

Harmonic power balance analysis by Manley and Rowe, well known to those skilled in the art, predicts the general relationship between the powers of the various frequencies flowing into and out of the vactor diodes(s) that comprise a parametric amplifier core. In the case of a parametric amplifier restricted by appropriate filtering to 3 frequency operation at RF, LO and USB only, the Manley Rowe relationship condenses to the simple geometric form illustrated in FIG. 5a. In FIG. 5a, positive power amplitude denotes power flow into the parametric amplifier core and negative power amplitude denotes power flow out of the core. The Manley Rowe relations predict that the power of the USB mixing product flowing out of the parametric amplifier core is limited to the lesser of <the power of the available RF scaled up by the ratio of the USB frequency to the RF frequency>, and <the power of the available LO scaled up by the ratio of the USB frequency to the RF frequency>. Typically LO power will be available in a parametric amplifier at surplus level and so the level of the USB output will be limited to the level of RF power scaled up by the ratio of the USB frequency to the RF frequency. In FIG. 5a, the simple construction of a straight line from the origin (of zero linear power amplitude a zero frequency) and through the point defined by the amplitude and frequency of the available RF power then predicts this level. This scaling of RF power level to USB level is the desired linear upconversion gain. Expressing gain in decibels this 3-frequency gain is limited to $20 \times \log(f_{USB}/f_{RF})$. In the case of an RF frequency of 63.6 MHz, an LO frequency of 2.44 GHz and a USB frequency of 2.5036 GHz this gain is just under 16 dB, which would not be sufficient to meet the requirements of the proposed wireless link in an MRI scanner.

The Manley Rowe relationships also remain satisfied if all power flows in the 3-frequency case are reversed. This would correspond with in-feed of power into the parametric amplifier core at the USB frequency and resultant outflow of power at the LO and RF frequencies simultaneously. By appropriate re-naming and frequency shifting of the signals in this reversed scenario, it is apparent that in a parametric amplifier restricted by appropriate filtering to 3 frequency operation at RF, LO and LSB frequencies, injection of power at the LO frequency only will result in generation of both RF and LSB outputs.

FIG. 5b illustrates fundamental 3-frequency upconversion to upper sideband, with RF and LO inputs resulting in generation of USB output. FIG. 5c illustrates fundamental 3-frequency upconversion to upper sideband, with the local oscillator shifted down by the RF frequency with respect to FIG. 5b. FIG. 5d shows FIG. 5b inverted, which is the configuration for self oscillation. A feed at the LO frequency splits into RF and LSB outputs. FIG. 5e illustrates an infinite gain condition. All LO power splits between the USB and LSB—there is no net power flow at RF, although the port will resonate.

Figure 6:
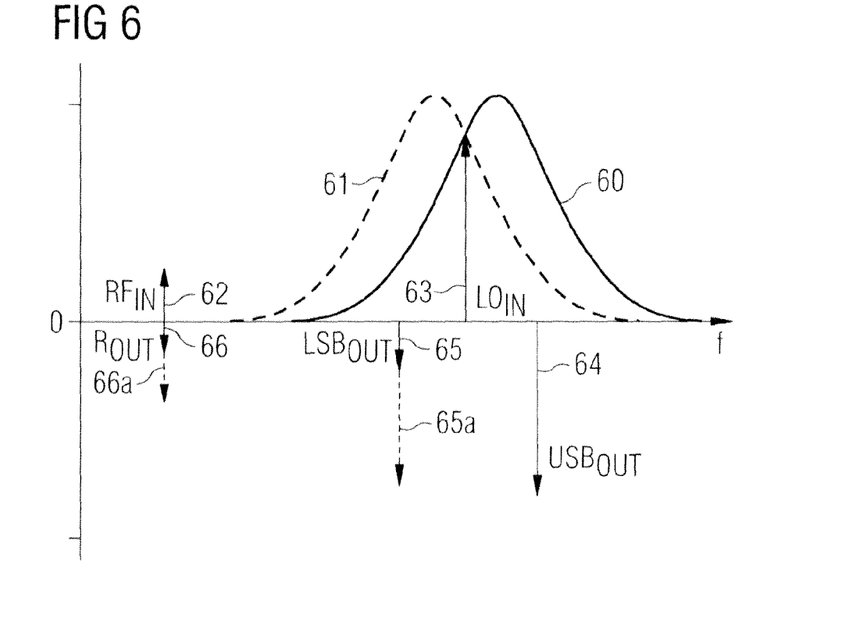
FIG. 6 illustrates 4-frequency operation in a parametric amplifier with suitable filtering.

The generation of a USB signal with or without the application of RF would alone be of little value since the conversion gain would be undefined and such a system would be widely regarded as unstable. If, however, a parametric amplifier is constructed in which by appropriate filtering 3 frequency operation at RF, LO and USB is favoured, but in which a controlled level of power flow is also permitted at the LSB frequency, as illustrated in FIG. 6, the production of the LSB signal 65 will be accompanied by a controlled outward flow of RF power 66. This will subtract from the incident RF power 62 to result in a reduced level of RF input power required to produce a given level of USB output 64. This resulting increased upconversion is commonly referred to as '4-frequency gain'. The output of RF power 66 from the RF port manifests in an RF port measurement as reduced return loss and at the point where the level of RF output is equal to the level of RF input, 0 dB return loss (a reflection coefficient of 1.0) is measured. This condition is ideal for application of the parametric amplifier upconverter to upconversion of the signals 13 from the patient coils 3 in an MRI scanner where resistive loading of the patient coil source impedance would degrade system noise performance. In an ideal lossless parametric amplifier, this condition will coincide with manifestation of upconversion gain of 6 db above the 3-frequency gain, that is 22 dB. In practice, losses in the system mean that higher gain will be reached before the input reflection coefficient of 1 is reached. In the region of 25-30 dB gain has been observed at an RF port reflection coefficient of approximately 1.

Increasing further the level of LSB 65a generated and hence the level of reflected RF power 66a beyond the level of incident RF power 62, the resulting RF port reflection coefficient greater than 1 can be regarded as a negative RF port impedance. Stable operation of the parametric amplifier is possible under these circumstances provided that the magnitude of the negative impedance presented at the RF port 21 is greater than the magnitude of the RF port source impedance. The approach to exact balance of RF port negative impedance with RF source impedance gives rapidly increasing (but finite) gain and beyond this point the parametric amplifier self oscillates.

With appropriate precision control of the 4-frequency effect, a level of gain appropriate for application in the wireless coil microwave link from antenna 5 to the antennas 6 can be achieved. In the inventions the correct balance of USB and LSB generation (and hence controlled 4-frequency gain) is controlled by the tuning of a single microwave port resonant circuit (formed by the capacitance of the varactor diodes 24, 25 and the microstrip resonant lines 26, 27) that defines the response of the system at each of the LO, USB and LSB frequencies.

Since the 4-frequency gain state requires careful balance of the USB and LSB signals, it is highly sensitive to microwave port loading (at LSB, LO and USB frequencies) and RF port drive impedance variation from the direct connection of the parametric amplifier RF port 21 to a patient coil. These challenges are addressed in this invention.

4-frequency gain is also sensitive to variation in LO level and control of stable operation under conditions of variable LO drive level has been described in GB0915653.0. Whilst a DC bias voltage (typically 3.0V) is applied to set the operating point of the varactor diode 24, 25 (and hence its static capacitance), the AC LO signal 7 applied to the parametric amplifier core 35 exercises the varactor diode up and down the CN curve, making excursions either side of the nominal operating point set by the bias voltage. Because the CN curve is non-linear, excursions to higher capacitance at lower bias voltage outweigh to a degree the excursions to lower capacitance at higher bias voltage and result in a dynamic (aggregate) capacitance that is higher than the DC capacitance set by the bias. This capacitance increase causes a decrease in the tuned centre frequency of the microwave port frequency response 61. In this way, increased LO drive level leads to increased level of USB output 64 and consequently increased 4-frequency gain. The natural increase in 4-frequency gain that results simply from the presence of more LO energy for upconversion adds to this effect. Compensation for these two additive effects by means of increasing the varactor diode bias voltage 22 at increased LO drive level is described in GB0915653.0.

As illustrated in FIG. 4, a pick up coil 3 which has been excited by magnetic resonance signals from a patient generates a signal 13 at the Larmor frequency which is input to the upconverter 4. The Larmor frequency signal 13 is received at an input to the parametric amplifier device 70, the device comprising a low noise amplifier (LNA) 32 and a two port parametric amplifier 35. After amplification the signal 13 is input to the radio frequency (RF) input 21 of the parametric amplifier 35. A radiated local oscillator (LO) signal 7 from the microwave antennas 12 mounted on the bore tube 2 is received at the microwave antenna 5 connected to the microwave frequency port 34 of the parametric amplifier. The RF signal 13 and LO signal 7 combine in the parametric amplifier to produce upper and lower sidebands, still within the bandwidth of the bore tube microwave antenna 12 and one, other, or both of the sidebands 8 are radiated for reception by receivers 9 in the bore which process the signals into magnetic resonance images.

Figure 7:
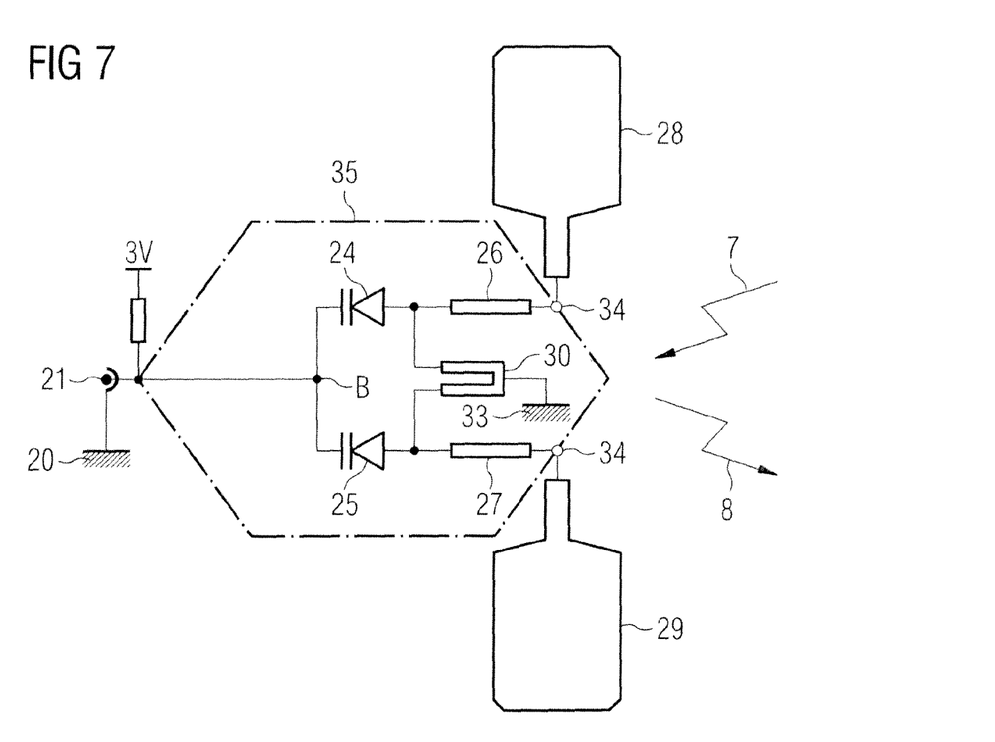
FIG. 7 shows the parametric amplifier of FIG. 2, modified in accordance with the present invention.

This arrangement is modified in the present invention to implement a parametric amplifier in the hybrid upconverter system, as shown in FIG. 7. This implementation relieves the parametric amplifier core of the need to provide high gain and low noise figure. The LNA stage 30 in the hybrid system provides of order 10 dB gain. This reduces the gain required of the parametric upconverter to a level that requires little 4-frequency effect. In addition, the LNA gain is able to overcome a relatively poor noise figure in the parametric amplifier core 35. The parametric amplifier core is therefore simplified because the high-Q RF port inductor 23 is no longer required and the output 82 of the LNA 32 is connected directly to the varactor diode pair 24, 25 at point B.

Direct common mode drive of the varactor diode pair 24, 25 by the resistive output of the LNA stage 32 is now possible and this heavily damps or de-Q's the parametric amplifier core. In this state, it is possible to operate the parametric amplifier with a heavy bias towards the LSB frequency 65 in the microwave port 34 because the heavy positive resistive loading of the core is able to absorb the resulting large negative impedance that arises in operation well into the 4-frequency region. This allows the peak in the response 61 of the microwave port tuning to be centred below the LO frequency. Operation in this state of tune now allows the two effects of increased LO drive level to cancel. Increased LO drive level still serves to provide more energy for upconversion but the down shift in microwave port centre frequency now results in reduced gain at both the LSB and USB frequencies 65, 64. The two effects now counteract. By appropriate careful design of the microwave port response and setting of the varactor diode bias voltage 22, the two effects can be arranged substantially to cancel over a usefully wide range of LO drive level. Control of upconversion gain to within ±0.75 dB over an LO range of 8 dB has been achieved using this invention.

Figure 3:
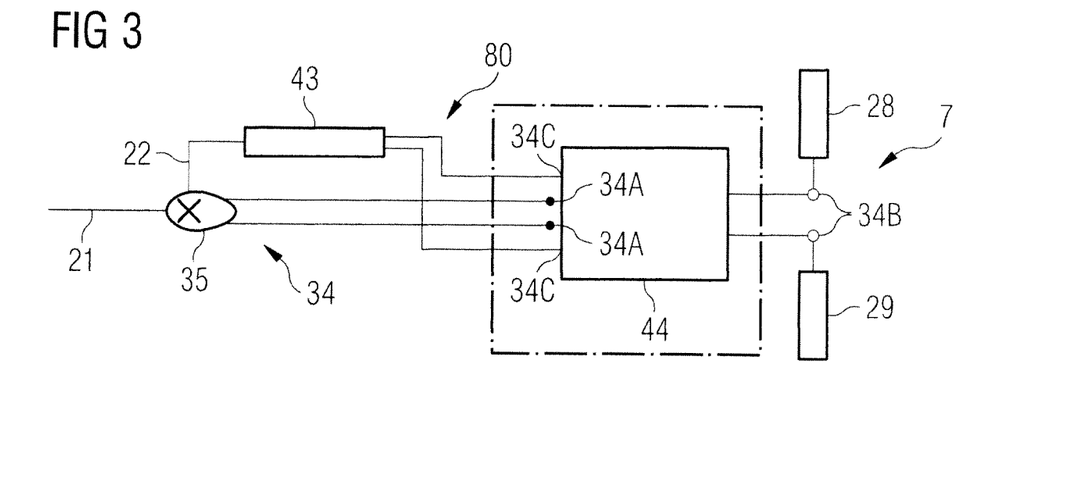
FIG. 3 is a block diagram of a conventional upconverter, using bias voltage control for a parametric amplifier according to FIG. 2.

A benefit of using a parametric amplifier of the type described above is that it is fully powered by the incident local oscillator signal, so no external DC power source is required. Thus, as shown in FIG. 3, an optional addition is the use of power harvesting to supply both the LNA 32 and the parametric amplifier 35, whereby the incident LO signal 7 at the microwave antenna 5 of the upconverter stage provides LO power to the parametric amplifier and part of the incident LO signal is input to a rectifier 43 and rectifies the LO power to produce a DC voltage to power the LNA. Furthermore, power harvesting may be used in combination with a power splitter 44. Port 34B is connected to the antenna 5 and port 34A is connected to the tuned microwave frequency port 34 of the parametric amplifier. In this example, the input to the power harvester 43 is received from port 34C of the two way splitter 44, which may have symmetry or asymmetry of power splitter powers. The splitter may take the form of a Wilkinson splitter, or directional coupler, to provide isolation between the two split parts of the LO signal.

DC power harvested 43 from the local oscillator 7 provides the necessary power supply 81 for the LNA 32 and also can also provide a DC bias voltage 22 for the parametric amplifier 35, whilst part of the incident LO signal is received at the microwave frequency port 34, which channels local oscillator power and returns upconverted side bands. The power harvesting circuit 43 typically takes the form of a rectifier and a reservoir circuit, e.g. a capacitor, arranged to obtain DC voltage, the circuit having a suitable voltage and current capability to provide the power 81 to the low noise amplifier, as well as providing the bias signal 22 to the parametric amplifier. The LNA is designed for very low power consumption and its output circuit is matched directly into the optimum input impedance of the parametric amplifier. A single voltage reference is used to supply the LNA drain voltage 81 and to bias the parametric amplifier by direct DC connection 22 to the parametric amplifier core 35.

However, in use in a wireless MRI coils system, there are many variables resulting from different patients, either due to different patients being at different distances from the microwave array, differences in clothing or the effect of reflections meaning that the actual LO received at each parametric amplifier antenna cannot be accurately controlled, or predicted. The use of a bias voltage as in the prior art, may not be sufficient to prevent instability.

As discussed above, if instead of filters with peaks at the USB and LO frequencies, a broad filter is set about the LSB, LO and USB signal frequencies, then the RF input plus LO input signals give rise to the USB output as before, but also some LSB output is passed as well as a limited amount of reflected RF output signal being generated. The power used to achieve this is only the difference between the RF in and the RF out, so departing from the constraints of the Manley Rowe equations and becoming a very high gain device. To balance the levels of LSB and USB, using a filter which passes these and the LO frequency appropriately, the passband may be shifted to one side or other of the LO. If the filter peak is closer to the LSB, then this also allows more RF output to be generated and eventually this reaches a point at which the system becomes completely unstable.

Figure 8:
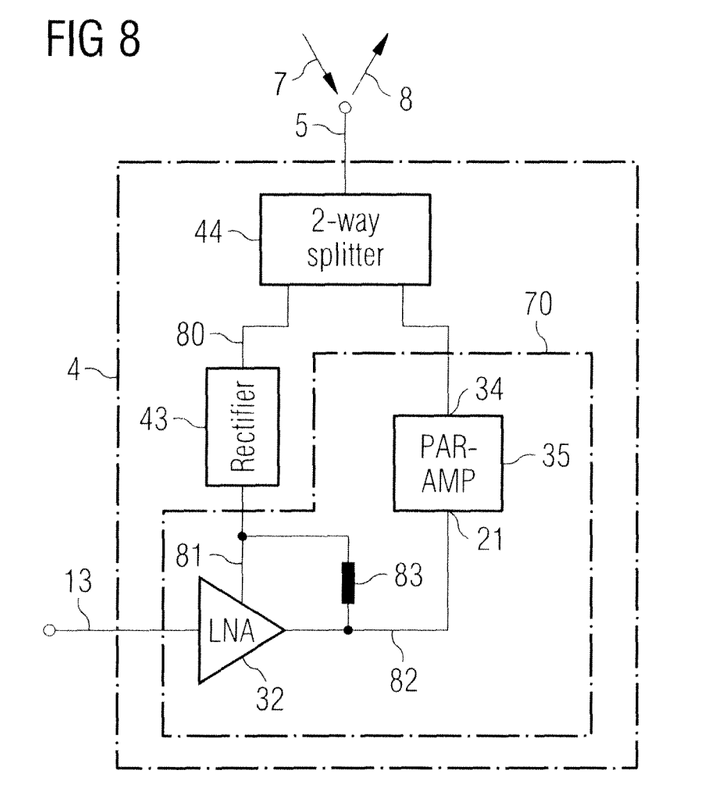
FIG. 8 shows a modified version of the upconverter circuit of FIG. 4.

To address the problems caused by the operational variables leading to increased LO signal level being received, some form of self-compensation is required to compensate for the change in gain of the parametric amplifier as the LO signal varies. In the prior art, this was achieved by using the parametric amplifier bias voltage, the voltage being modified by a change in incident LO signal level. The present invention addresses the problem by reducing the required gain, so allowing operation of a circuit where the tuned microwave port frequency is lower than the LO frequency. The output impedance of the LNA 32 is typically of the order of several thousand ohms. As can be seen in FIG. 8, the output 82 of the LNA is directly connected to the varactor diode pair 24, 25 at point B of the parametric amplifier, as the high Q RF port inductor 23 is not required. The output impedance of the LNA may be reduced by additional drain loading 83 bringing the value down to the order of hundreds of ohms and in one embodiment, to a value of 270Ω. Damping of the parametric amplifier by driving it from a relatively low impedance, reduces the gain. The presence of the LNA before the input 21 means that the parametric amplifier 35 no longer needs to be operating at its optimum efficiency as the LNA 32 compensates for the reduction in overall gain in the parametric amplifier.

In the hybrid parametric amplifier circuit, the gain of the low noise amplifier suppresses the significance of the input noise of the parametric amplifier core. Thus, the parametric amplifier core does not need to operate with best noise figure match and can be operated with a drive impedance that is lower than in that which be required to give optimum gain and noise figure. By damping the parametric amplifier gain with a low impedance drive to the RF input port 21 of the parametric amplifier, the parametric amplifier 35 can be operated below the region of instability with the LO frequency being higher than the tuned microwave port centre frequency. An increase in LO in these circumstances increases the signal levels and shifts the centre frequency of the microwave port 34 towards the LSB frequency. However, neither change is sufficient that the operation becomes unstable. Use of a low drive impedance to damp the parametric amplifier core allows an inherently four-frequency parametric amplifier core to be pumped with an LO frequency above the centre frequency of the microwave port.

Typical figures under the Manley Rowe constraints are about 13 dB gain for 3 frequency operation, whereas the particular application of wireless coils requires a gain in the order of 20 dB to 25 dB. By using a low noise amplifier in addition to the parametric amplifier, the input impedance of the parametric amplifier can be controlled and the required gain within the parametric amplifier reduced to values of the order of 10 dB to 12 dB. The LNA 32, even operating with very low bias current, can produce a gain of 15 dB to 18 dB, whilst only taking a current of 0.25 mA, rather than a more conventional 10 mA. Thus, the power to the parametric amplifier is not unduly reduced by needing to also power the LNA, but the reduction in required gain in the parametric amplifier meaning that it does not need to be optimised, brings the operating region well within that required for stability. The figures given are based on the example of a 63 MHz input to an RF port and a 2.442 GHz local oscillator input to the microwave port. The gain can be kept constant to about +/−0.5 dB over a 10 dB range.

Figure 9:
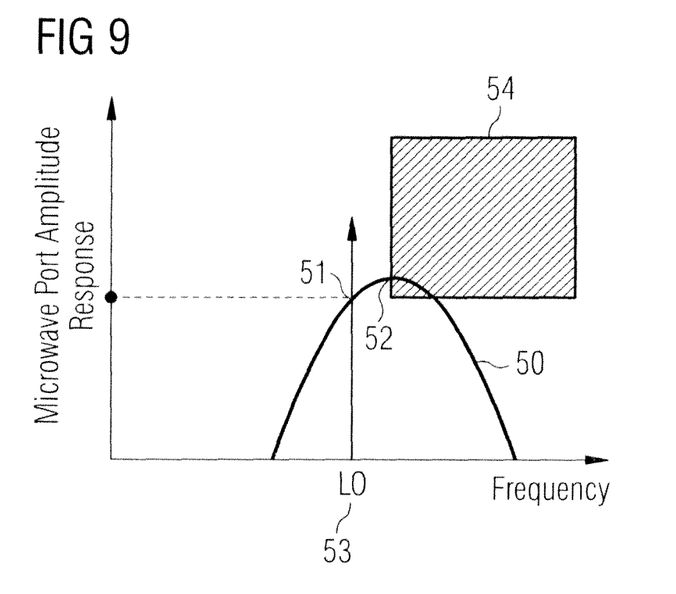
FIG. 9 shows microwave port amplitude response against frequency for a high Q parametric amplifier with normal local oscillator drive level.
Figure 10:
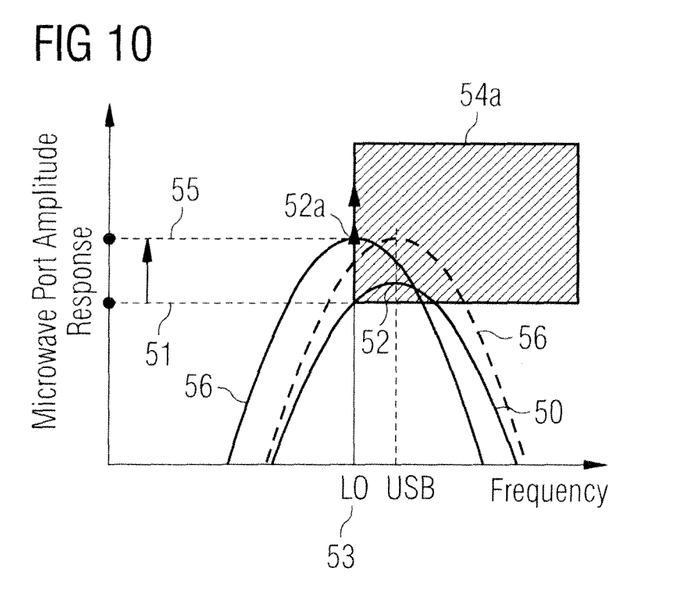
FIG. 10 shows microwave port amplitude response against frequency with increased local oscillator drive level.

The graphs of FIGS. 9 to 12 illustrate the beneficial effect of the present invention in more detail, showing microwave port amplitude response against frequency. FIG. 9 illustrates the response 50 of a high Q parametric amplifier 35, with a normal LO drive level and an amplitude 51 at the LO frequency. The microwave port 34 of the parametric amplifier is tuned to have a centre frequency 52 which is higher than the LO frequency 53, in order to achieve stable operation. Above the microwave port centre frequency 52, the response would be unstable, as this is in the region of instability 54. FIG. 10 illustrates how an increase in LO drive level causes the response amplitude 55 to increase and the centre frequency 52a to shift from the region of the USB towards the LO frequency 53. The curve 56 is now well into the region of instability. The two effects add at the LO frequency, so that the parametric amplifier becomes unstable.

Figure 11:
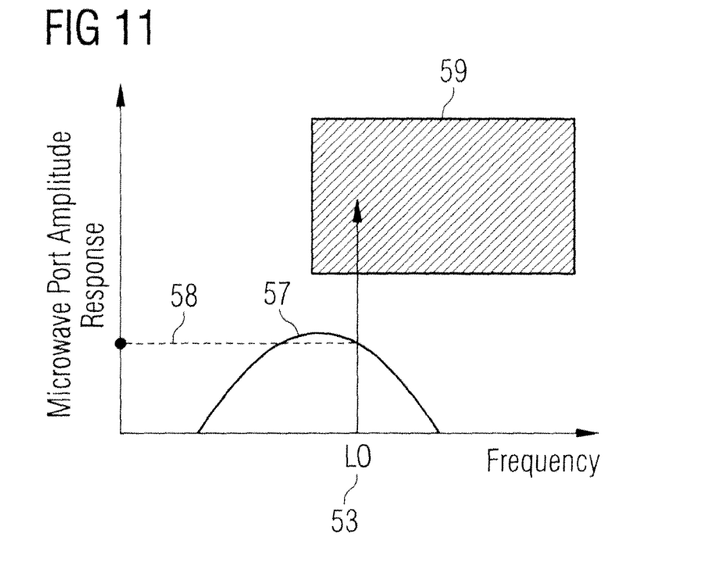
FIG. 11 shows microwave port amplitude response against frequency for an RF damped parametric amplifier in an upconverter according to the present invention, with normal local oscillator drive level.
Figure 12:
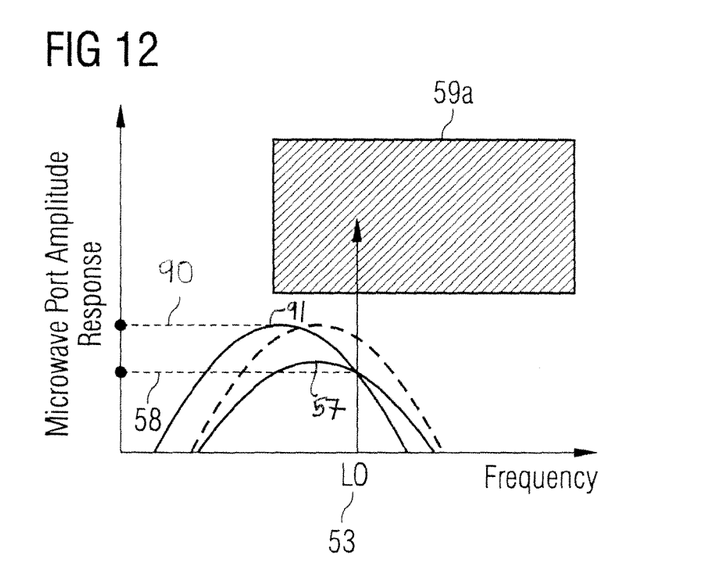
FIG. 12 shows microwave port amplitude response against frequency for the RF damped parametric amplifier in an upconverter according to the present invention, with increased local oscillator drive level.

The present invention addresses the problems shown here, as indicated in FIG. 11, by using a suitable input impedance to damp the signal received at the RF input 21 of the parametric amplifier 35. The damping may be achieved as shown in FIG. 7 by omitting the high Q RF input inductor 23 and connecting the LNA directly to the relatively high impedance point B of the varactor diode pair. Using a normal LO drive level, with the microwave port 34 tuned to a centre frequency 57 below the LO frequency 53, the amplitude response level 58 is still well below the region of instability and the response of the damped parametric amplifier is stable above the microwave port centre frequency 57. From FIG. 12, it can be seen that increasing the LO drive level and the consequential increase in amplitude response level 90 and shift in centre frequency 91 still do not bring the response into the extended region of instability 59a, so the parametric amplifier 35 remains stable. Thus, by providing a device incorporating a LNA in conjunction with a damped input to the parametric amplifier 35, stable 4-frequency operation can be achieved Operation of a parametric amplifier core with LO frequency above the microwave port tuned frequency allows the implementation of self compensation. Increased LO drive level has 2 effects in a parametric amplifier core. Firstly, it leads to increased upconversion gain because more LO energy is available for conversion to LSB and USB signals in what is inherently a mixer. Secondly, increased LO drive level also leads to increased dynamic capacitance of the varactor diodes and hence reduced microwave port centre frequency. Operating the parametric amplifier with the LO on the high side of centre, this second effect leads to reduced upconversion gain. With correct tuning, over a limited range of LO drive levels these two effects can be arranged to cancel to a first order leading to substantially constant gain over the variation in LO drive level. This is illustrated in FIGS. 11 and 12.

Although modifications and changes may be suggested by those skilled in the art, it is the intention of the inventor to embody within the patent warranted hereon all changes and modifications as reasonably and properly come within the scope of his contribution to the art.

I claim as my invention:

1. A hybrid upconverter comprising:
a low noise amplifier and a two port parametric amplifier, the two port parametric amplifier comprising a first port to receive an input signal to be amplified and upconverted and a second port to receive a local oscillator signal and to output an amplified, upconverted signal at upper and lower sideband frequencies;
the parametric amplifier further comprising an antenna coupled to the second port to receive the local oscillator signal and transmit the amplified, upconverted signal at upper and lower sideband frequencies;
the low noise amplifier driving the first port of the parametric amplifier;
the two port parametric amplifier further comprising a pair of varactor diodes connected between the first port and the second port; and
the diodes being connected in parallel from the first port and in series from the second port, and the low noise amplifier being connected directly to the pair of varactor diodes.

2. An upconverter according to claim 1, wherein the output impedance of the low noise amplifier is reduced by additional drain loading.

3. An upconverter according to claim 2, wherein the additional drain loading reduces the output impedance to a value of the order of 270Ω.

4. An upconverter according to claim 1, further comprising a power harvester that receives local oscillator power and generates a DC bias voltage for the parametric amplifier and a supply for the low noise amplifier.

5. An upconverter according to claim 4, wherein the low noise amplifier supplies the bias voltage to the parametric amplifier.

6. An upconverter according to claim 4, wherein the upconverter further comprises a power splitter between the antenna and the parametric amplifier;
wherein the power splitter splits incident local oscillator power between the power harvester and the parametric amplifier.

7. An upconverter according to claim 1, wherein the first port is an RF port.

8. An upconverter according to claim 7, wherein the first port receives signals in the frequency range 20 MHz to 500 MHz.

9. An upconverter according to claim 1, wherein the second port is a microwave port.

10. An upconverter according to claim 9, wherein the second port receives signals in the frequency range 1 GHz to 5 GHz.

11. A wireless magnetic resonance system comprising:
a data acquisition unit having a bore therein configured to receive an examination subject;
a local oscillator and a transceiver array mounted in said bore;
a wireless local coil array and an upconverter stage comprising a plurality of upconverters; and
each of said upconverters being a hybrid converter and comprising a low noise amplifier and a two port parametric amplifier, the two port parametric amplifier comprising a first port to receive an input signal to be amplified and upconverted and a second port to receive a local oscillator signal and to output one amplified, upconverted signal at upper and lower sideband frequencies, the parametric amplifier further comprising an antenna coupled to the second port to receive the local oscillator signal and transmit the amplified, upconverted signal at upper and lower sideband frequencies, the low noise amplifier driving the first port of the parametric amplifier, the two port parametric amplifier further comprising a pair of varactor diodes connected between the first port and the second port, and the diodes being connected in parallel from the first port and in series from the second port, and the low noise amplifier being connected directly to the pair of varactor diodes.

12. A method of controlling gain in a hybrid upconverter comprising a two port parametric amplifier and a low noise amplifier; wherein the two port parametric amplifier comprises a first port to receive an input signal to be amplified and upconverted, a second port to receive a local oscillator signal and to output the amplified, upconverted signal at upper and lower sideband frequencies and a pair of varactor diodes connected between the first port and the second port, the method comprising:
- connecting the varactor diodes in parallel from the first port and in series from the second port;
- connecting the low noise amplifier output directly to the pair of varactor diodes; and
- driving the parametric amplifier with the low noise amplifier.

13. A method according to claim 12, further comprising reducing the output impedance of the low noise amplifier by additional drain loading.

14. A method according to claim 13, wherein the additional drain loading reduces the output impedance to a value of the order of 270Ω.

15. A method according to claim 12, wherein the first port receives signals in the frequency range 20 MHz to 500 MHz.

16. A method according to claim 12, wherein the second port receives signals in the frequency range 1 GHz to 5 GHz.

* * * * *